US009279674B2

(12) United States Patent  
Tian

(10) Patent No.: US 9,279,674 B2  
(45) Date of Patent: Mar. 8, 2016

(54) METHOD OF TESTING BLOCKING ABILITY OF PHOTORESIST BLOCKING LAYER FOR ION IMPLANTATION

(71) Applicant: BOE TECHNOLOGY GROUP CO., LTD., Beijing (CN)

(72) Inventor: Hui Tian, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/376,790

(22) PCT Filed: Nov. 19, 2013

(86) PCT No.: PCT/CN2013/087442  
§ 371 (c)(1),  
(2) Date: Aug. 5, 2014

(87) PCT Pub. No.: WO2015/027577  
PCT Pub. Date: Mar. 5, 2015

(65) Prior Publication Data  
US 2015/0168138 A1 Jun. 18, 2015

(30) Foreign Application Priority Data  
Aug. 29, 2013 (CN) .......................... 2013 1 0385397

(51) Int. Cl.  
G01B 15/02 (2006.01)  
G03F 7/20 (2006.01)  
G01Q 60/24 (2010.01)

(52) U.S. Cl.  
CPC ................ G01B 15/02 (2013.01); G01Q 60/24 (2013.01); G03F 7/20 (2013.01)

(58) Field of Classification Search  
CPC ................................ G01B 15/02; G01Q 60/24  
See application file for complete search history.

(56) References Cited

FOREIGN PATENT DOCUMENTS

| CN | 102403245 A | 4/2012 |
|---|---|---|
| CN | 102893218 A | 1/2013 |

OTHER PUBLICATIONS

English Translation of the International Search Report of PCT/CN2013/087442 published in English on Mar. 5, 2015.  
International Search Report, International Preliminary Report on Patentability and Written Opinion of the International Searching Authority of PCT/CN2013/087442 in Chinese, mailed Jun. 4, 2014.  
Written Opinion of the International Searching Authority of PCT/CN2013/087442 in English mailed Jun. 4, 2014.  
Chinese Office Action of Chinese Application No. 201310385397.6, mailed Jul. 3, 2015 with English translation.

Primary Examiner — Stephen Rosasco  
(74) Attorney, Agent, or Firm — Collard & Roe, P.C.

(57) ABSTRACT

A method of testing a blocking ability of a photoresist blocking layer for ion implantation, comprising: forming a photoresist blocking layer (S1) on a substrate; measuring a first thickness (S2) of the photoresist blocking layer at an arbitrary position on the substrate, the first thickness being a thickness of the photoresist blocking layer; implanting a predetermined amount of ions (S3) into the photoresist blocking layer; measuring a second thickness (S4) of the photoresist blocking layer at the arbitrary position, the second thickness being a thickness of a hardened portion in the photoresist blocking layer; and determining a blocking ability (S5) of the photoresist blocking layer with the first thickness for ion implantation according to the second thickness. This method does not need to use a testing silicon slice during the process of testing the blocking ability of a photoresist blocking layer for ion implantation, and thus can reduce required costs during the testing process.

15 Claims, 2 Drawing Sheets

METHOD OF TESTING BLOCKING ABILITY OF PHOTORESIST BLOCKING LAYER FOR ION IMPLANTATION

CROSS REFERENCE TO RELATED APPLICATIONS

This application is the National Stage of PCT/CN2013/087442 filed on Nov. 19, 2013, which claims priority under 35 U.S.C. §119 of Chinese Application No. 201310385397.6 filed on Aug. 29, 2013, the disclosure of which is incorporated by reference.

TECHNICAL FIELD

Embodiments of the present invention relate to a method of testing the blocking ability of a photoresist blocking layer for ion implantation.

BACKGROUND

Ion implantation technology, as a doping technology of a semiconductor material, has advantages of low-temperature doping, easy masking, precise dosage control and high uniformity, can be used in a plurality of processes such as source/drain electrode doping, channel doping, lightly-doped drain doping, and can make a manufactured semiconductor device have the properties such as fast speed, low power consumption, good stability, high yield and so on. In different ion implantation technologies, conditions such as required energy dosage and the like are different, and doping is performed in a designated region during ion implantation, and the rest positions need to be masked (shielded) by a blocking layer such as a photoresist layer. The blocking abilities of photoresist blocking layers with different thicknesses for ion implantation are different, ions can easily pass through a blocking layer of a too small thickness, while for a photoresist blocking layer of a too large thickness, it is hard to control the key feature during a photolithograph process, and thus it is required to select a photoresist blocking layer with a suitable thickness during implantation.

A conventional method of determining the blocking ability of a photoresist blocking layer comprises the following steps: providing a plurality of testing silicon slices; coating photoresist layers with different thicknesses on different testing silicon slices; measuring the thickness of the photoresist of each silicon slice; implanting ions with a certain energy into the abovementioned silicon slices coated with the photoresist layers with different thicknesses; removing the photoresist layers of the silicon slices; and using a secondary ion mass spectrometry to test the silicon slices to obtain ion implantation amounts of all the silicon slices, and when an ion amount is in an allowed range, the thickness of the photoresist blocking layer, to which the silicon slice with this ion amount corresponds, is considered to be suitable.

SUMMARY

An aspect of the present invention provides a method of testing a blocking ability of a photoresist blocking layer for ion implantation, comprising: forming a photoresist blocking layer on a substrate; measuring a first thickness of the photoresist blocking layer at an arbitrary position on the substrate, the first thickness being a thickness of the photoresist blocking layer; implanting a predetermined amount of ions into the photoresist blocking layer; measuring a second thickness of the photoresist blocking layer at the arbitrary position, the second thickness being a thickness of a hardened portion in the photoresist blocking layer; and determining blocking ability of the photoresist blocking layer with the first thickness for ion implantation based on the second thickness.

For example, forming a photoresist blocking layer on a substrate may be conducted as follows: a prebaking process is performed to the substrate; a photoresist layer is formed on the substrate subsequent to the prebaking process; and an exposing and developing process is performed upon the photoresist layer to obtain the photoresist blocking layer.

For example, a prebaking temperature of the prebaking process may be 10~120 degree Celsius (° C.), and a time period of the prebaking process may be 10~120 seconds (s).

For example, a photoresist layer is exposed at different positions using different exposing times to obtain photoresist blocking layers with different thicknesses. For example, the thicknesses of the photoresist blocking layer present a gradient change along a length direction or a width direction of the substrate.

For example, determining blocking ability of the photoresist blocking layer with the first thickness for ion implantation based on the second thickness comprises: calculating a ratio of the second thickness to the first thickness; and determining whether the ratio is smaller than or equal to a predetermined threshold value, and if it is so, the photoresist blocking layer with the first thickness is determined to comprise the blocking ability for ion implantation, otherwise, the photoresist blocking layer with the first thickness is determined to not comprise the blocking ability for ion implantation.

For example, the threshold value may be any value in a range of [0.85, 0.95].

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In the above-mentioned conventional method, in order to determine the blocking ability of a photoresist for ion implantation, it is necessary to test as many silicon slices as possible with respect to their ion implantation amounts sequentially. This method, in one aspect, needs a lot of expensive testing silicon slices, and in another aspect, the secondary ion mass spectrometry is also a very expensive testing means and consumes lots of testing time, which increases testing costs and time greatly. Therefore, it's required to solve the problem of overly high testing costs caused by the use of many testing silicon slices during the process of evaluating the blocking ability of a photoresist blocking layer.

Figure 1:
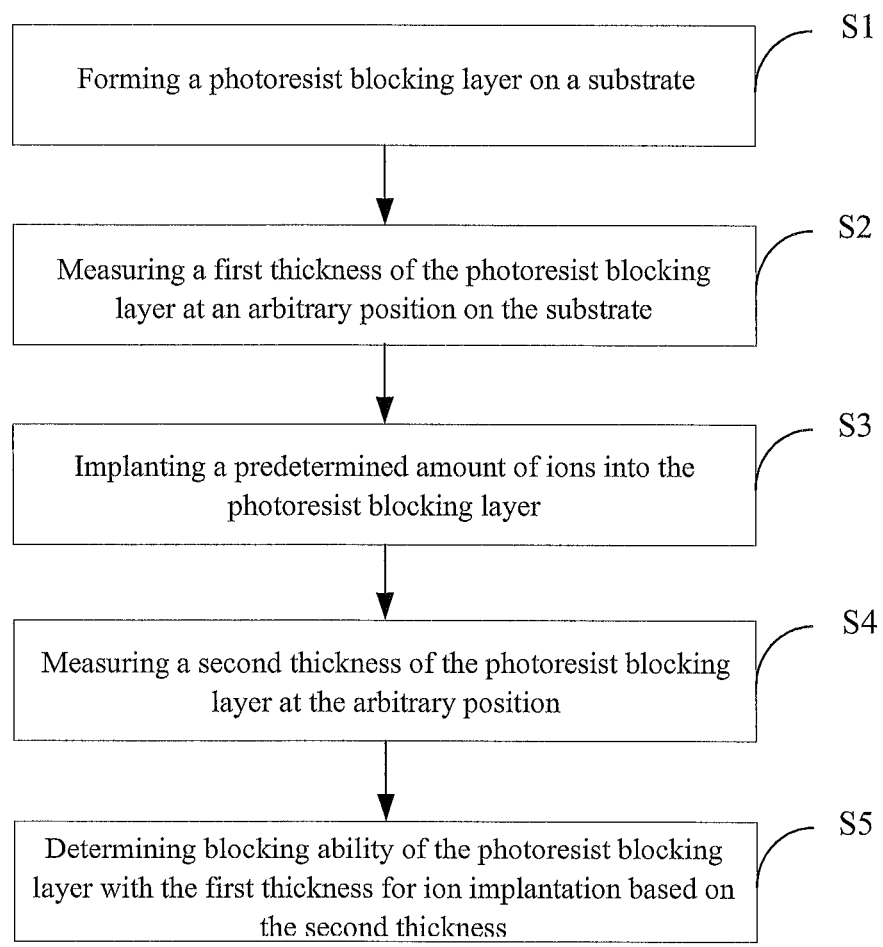
FIG. 1 is a flow chart illustrating a method of testing a blocking ability of a photoresist blocking layer for ion implantation provided by an embodiment of the present invention.

FIG. 1 is a flow chart illustrating a method of testing blocking ability of a photoresist blocking layer for ion implantation provided by an embodiment of the present invention. The method can be performed as follows.

(S1) Forming a photoresist blocking layer on a substrate.

For example, this substrate can be a glass substrate, a quartz substrate and so on.

(S2) Measuring a first thickness in the photoresist blocking layer at an arbitrary position on the substrate, and the first thickness is a thickness of the photoresist layer.

(S3) Implanting a predetermined amount of ions into the photoresist blocking layer.

In implanting a certain amount of ions with a certain energy into the photoresist blocking layer, the ions can be any ions (for example, boron ions or phosphorus ions) used in ion implantation technologies, and their energies and amounts can be predetermined according to the specification of ion implantation equipments, for example, their energy range can be 0-100 kv, for example, 20-90 kv; the dosage range can be 0-1e16, for example, 1e13-0.9e16. The function of the ion implantation is to make the portion where the ions reach in the photoresist blocking layer carbonized and hardened, after the ions are implanted into the photoresist blocking layer, the portion of the photoresist blocking layer where the ions reach (bombard) is carbonized and hardened, to form an obvious boundary in the thickness direction with respect to the portion where the ions do not reach. The positions of this photoresist blocking layer where the ions are implanted at least comprise the portion where the first thickness is measured in the preceding steps.

(S4) measuring a second thickness in the photoresist blocking layer at the arbitrary position, and the second thickness is a thickness of a hardened portion in the photoresist blocking layer.

After the ions are implanted, the portion of the photoresist blocking layer where the ions reach is carbonized and hardened to form an obvious boundary in the thickness direction with respect to the portion that is not doped. By means of the longitudinal cross-section of the substrate, the thickness of the hardened portion of the photoresist blocking layer can be measured. For example, scanning electron microscope (SEM), atomic force microscope (AFM), transmission electron microscope (TEM) or similar method can be used to measure the cross-sectional pattern of the photoresist blocking layer after the ion implantation to obtain the thickness of the hardened portion in the photoresist blocking layer.

(S5) Determining the blocking ability of the photoresist blocking layer with the first thickness for ion implantation according to the second thickness.

In the method of testing a blocking ability of a photoresist blocking layer for ion implantation provided by the embodiment of the present invention, by implanting a certain amount of ions with a certain energy into the photoresist blocking layer, the portion of the photoresist blocking layer where the ions reach is carbonized and hardened after the ion implantation, and form an obvious boundary in the thickness direction with respect to an non-doped portion. According to the thickness of the hardened portion in the photoresist blocking layer, whether the photoresist blocking layer has the suitable blocking ability for ion implantation can determined, and this method avoids coating photoresist layers with different thicknesses on testing silicon slices, saves the material costs, and then reduces the required costs during the testing process.

Preferably, in order to make the testing results more precise, an example of the step S1 can be performed as follows. A prebaking process is performed with respect to the substrate; a photoresist layer is formed on the substrate subsequent to the prebaking process; and an exposing and developing process is performed with respect to the photoresist layer to obtain the photoresist blocking layer.

For example, a prebaking temperature of the prebaking process is 10~120° C., for example, may be 80 degree, and a time period of the prebaking process is 10~120 s, for example, may be 110 seconds.

For example, the photoresist at different positions is exposed for different exposing time periods to obtain photoresist blocking layers with different thicknesses. Because the exposing time is longer, the thickness of the photoresist blocking layer is smaller, if the exposing times are reduced or increased along the length direction or the width direction of the substrate gradually, the thicknesses of the obtained photoresist blocking layers present an increasing or reducing trend along the length direction or the width direction of the substrate, namely, the thickness of the photoresist blocking layer presents a gradient change along the length direction or the width direction of the substrate. Here, by choosing a plurality of positions of the photoresist blocking layer with different thicknesses, the blocking ability of the photoresist blocking layers with different thicknesses for ion implantation can be observed better.

For example, an example of the step S5 can be performed as follows: calculating a ratio of the second thickness to the first thickness; and determining whether the ratio is smaller than or equal to a predetermined threshold value, and if it is so, the photoresist blocking layer with the first thickness is determined to possess the blocking ability for ion implantation, otherwise, the photoresist blocking layer with the first thickness is determined to not possess the blocking ability for ion implantation.

Figure 2:
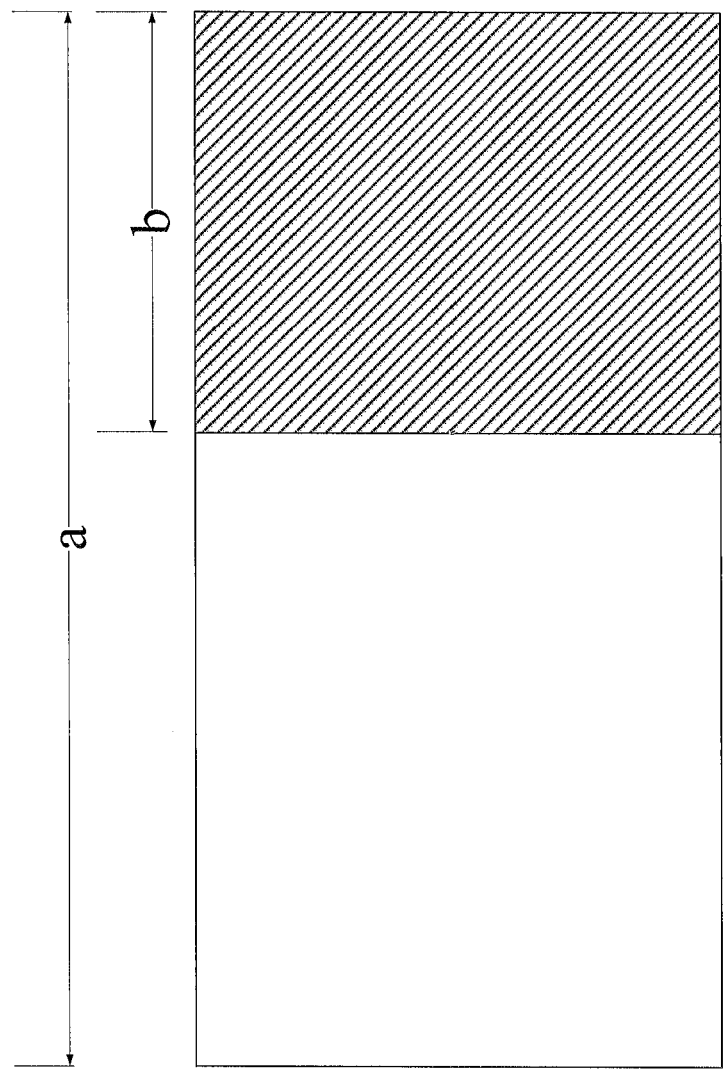
FIG. 2 is a schematic longitudinal-section view of a photoresist blocking layer provided by an embodiment of the present invention after an ion implantation.

For example, FIG. 2 is a longitudinal cross-section view of a photoresist blocking layer at a position after ion implantation; "a" is the thickness of the whole photoresist blocking layer (namely, the first thickness), and "b" is the thickness of the hardened portion in the photoresist blocking layer (namely, the second thickness). The ratio of the second thickness to the first thickness b/a is calculated, and is compared with a predetermined threshold value. If b/a is smaller than or equal to the predetermined threshold value, the photoresist blocking layer with the first thickness is determined to have the blocking ability for ion implantation, otherwise, the photoresist blocking layer with the first thickness is determined to not have the blocking ability for ion implantation.

For example, the threshold value may be any value in a range of [0.85, 0.95], for example, may be 0.9.

In the method of testing a blocking ability of a photoresist blocking layer for ion implantation provided by the embodiments of the present invention, firstly, photoresist blocking layers with different thicknesses are formed on a substrate, and a certain amount of ions with certain energy are implanted into the photoresist blocking layers; after the ion implantation, the portion of the photoresist blocking layer is carbonized and hardened, to form an obvious boundary in the thickness direction with respect to an non-doped portion; by testing the longitudinal cross-section pattern of the substrate samples of the photoresist blocking layers with different thicknesses, to obtain the ratio of the thickness of the hardened portion of the photoresist blocking layer to the thickness of the whole photoresist blocking layer; if the ratio is within an allowed range, the photoresist blocking layer with this thickness is determined to have suitable blocking ability for ion implantation. This method not only avoids using a plurality of testing silicon slices to coat photoresist with different thicknesses for many times to save the material costs, but also overcome the shortage of the current technology that the secondary ion mass spectrometry test is expensive and time-consuming, reducing the test costs and time greatly.

What are described above is related to the illustrative embodiments of the disclosure only and not limitative to the scope of the disclosure; the scopes of the disclosure are defined by the accompanying claims.

The invention claimed is:

1. A method of testing a blocking ability of a photoresist blocking layer for ion implantation, comprising:
   forming a photoresist blocking layer on a substrate;
   measuring a first thickness of the photoresist blocking layer at an arbitrary position on the substrate, the first thickness being a thickness of the photoresist blocking layer;
   implanting a predetermined amount of ions into the photoresist blocking layer;
   measuring a second thickness of the photoresist blocking layer at the arbitrary position, the second thickness being a thickness of a hardened portion in the photoresist blocking layer; and
   determining blocking ability of the photoresist blocking layer with the first thickness for ion implantation based on the second thickness.

2. The method of testing a blocking ability of a photoresist blocking layer for ion implantation as claimed in claim 1, wherein a prebaking process is performed to the substrate; a photoresist layer is formed on the substrate subsequent to the prebaking process; and an exposing and developing process is performed upon the photoresist layer to obtain the photoresist blocking layer.

3. The method of testing a blocking ability of a photoresist blocking layer for ion implantation as claimed in claim 2, wherein a prebaking temperature of the prebaking process is 10~120° C., and a time period of the prebaking process is 10~120s.

4. The method of testing a blocking ability of a photoresist blocking layer for ion implantation as claimed in claim 3, wherein determining blocking ability of the photoresist blocking layer with the first thickness for ion implantation based on the second thickness comprises:
   calculating a ratio of the second thickness to the first thickness; and
   determining whether the ratio is smaller than or equal to a predetermined threshold value, wherein if it is so, the photoresist blocking layer with the first thickness is determined to possess the blocking ability for ion implantation, otherwise, the photoresist blocking layer with the first thickness is determined to not possess the blocking ability for ion implantation.

5. The method of testing a blocking ability of a photoresist blocking layer for ion implantation as claimed in claim 4, wherein the threshold value is any value in a range of 0.85 to 0.95.

6. The method of testing a blocking ability of a photoresist blocking layer for ion implantation as claimed in claim 2, wherein a photoresist layer is exposed at different positions using different exposing time periods to obtain photoresist blocking layers with different thicknesses.

7. The method of testing a blocking ability of a photoresist blocking layer for ion implantation as claimed in claim 6, wherein thicknesses of the photoresist blocking layers present a gradient change along a length direction or a width direction of the substrate.

8. The method of testing a blocking ability of a photoresist blocking layer for ion implantation as claimed in claim 7, wherein determining blocking ability of the photoresist blocking layer with the first thickness for ion implantation based on the second thickness comprises:
   calculating a ratio of the second thickness to the first thickness; and
   determining whether the ratio is smaller than or equal to a predetermined threshold value, wherein if it is so, the photoresist blocking layer with the first thickness is determined to possess the blocking ability for ion implantation, otherwise, the photoresist blocking layer with the first thickness is determined to not possess the blocking ability for ion implantation.

9. The method of testing a blocking ability of a photoresist blocking layer for ion implantation as claimed in claim 8, wherein the threshold value is any value in a range of 0.85 to 0.95.

10. The method of testing a blocking ability of a photoresist blocking layer for ion implantation as claimed in claim 6, wherein determining blocking ability of the photoresist blocking layer with the first thickness for ion implantation based on the second thickness comprises:
    calculating a ratio of the second thickness to the first thickness; and
    determining whether the ratio is smaller than or equal to a predetermined threshold value, wherein if it is so, the photoresist blocking layer with the first thickness is determined to possess the blocking ability for ion implantation, otherwise, the photoresist blocking layer with the first thickness is determined to not possess the blocking ability for ion implantation.

11. The method of testing a blocking ability of a photoresist blocking layer for ion implantation as claimed in claim 10, wherein the threshold value is any value in a range of 0.85 to 0.95.

12. The method of testing a blocking ability of a photoresist blocking layer for ion implantation as claimed in claim 2, wherein determining blocking ability of the photoresist blocking layer with the first thickness for ion implantation based on the second thickness comprises:
    calculating a ratio of the second thickness to the first thickness; and
    determining whether the ratio is smaller than or equal to a predetermined threshold value, wherein if it is so, the photoresist blocking layer with the first thickness is determined to possess the blocking ability for ion implantation, otherwise, the photoresist blocking layer with the first thickness is determined to not possess the blocking ability for ion implantation.

13. The method of testing a blocking ability of a photoresist blocking layer for ion implantation as claimed in claim 8, wherein the threshold value is any value in a range of 0.85 to 0.95.

14. The method of testing a blocking ability of a photoresist blocking layer for ion implantation as claimed in claim 1, wherein determining blocking ability of the photoresist blocking layer with the first thickness for ion implantation based on the second thickness comprises:
    calculating a ratio of the second thickness to the first thickness; and
    determining whether the ratio is smaller than or equal to a predetermined threshold value, wherein if it is so, the photoresist blocking layer with the first thickness is determined to possess the blocking ability for ion implantation, otherwise, the photoresist blocking layer with the first thickness is determined to not possess the blocking ability for ion implantation.

15. The method of testing a blocking ability of a photoresist blocking layer for ion implantation as claimed in claim 14, wherein the threshold value is any value in a range of 0.85 to 0.95.

* * * * *